United States Patent [19]
Ohmori et al.

[11] Patent Number: 5,331,213
[45] Date of Patent: Jul. 19, 1994

[54] PULSE TRANSMISSION CIRCUIT WITH UNDERSHOOT ELIMINATING CIRCUITRY

[75] Inventors: Hisakazu Ohmori; Yukio Furukawa; Masakazu Oi; Akihiko Takada, all of Kawasaki, Japan

[73] Assignee: Fujitsu Limited, Kawasaki, Japan

[21] Appl. No.: 910,507

[22] Filed: Jul. 8, 1992

[30] Foreign Application Priority Data

Jul. 11, 1991 [JP] Japan .................. 3-197122

[51] Int. Cl.⁵ .............................................. H03K 5/01
[52] U.S. Cl. .................... 307/108; 307/282; 307/246; 328/65
[58] Field of Search ............... 307/106, 107, 108, 246, 307/282, 296.3, 296.6, 323; 328/65, 67; 331/128

[56] References Cited

U.S. PATENT DOCUMENTS

3,214,707 10/1965 Wuerker .......................... 331/128

Primary Examiner—Timothy P. Callahan
Assistant Examiner—Shawn Riley
Attorney, Agent, or Firm—Armstrong, Westerman, Hattori, McLeland & Naughton

[57] ABSTRACT

An undershoot eliminating circuit is provided between a pulse transformer of a pulse transmitter coupled to a transmission line and a pulse transformer driving circuit for driving the pulse transformer. The pulse transformer driving circuit has an impedance high enough to cause the pulse transmitter to be substantially isolated from the transmission line. The undershoot eliminating circuit includes a capacitor, and a switching unit. The switching unit is connected to the capacitor, and has the function of selectively connecting the capacitor to the pulse transformer driving circuit and the pulse transformer in parallel on the basis of a voltage based on a pulse wave generated by the pulse transformer driving circuit and applied across the switching unit.

17 Claims, 12 Drawing Sheets

PULSE TRANSMISSION CIRCUIT WITH UNDERSHOOT ELIMINATING CIRCUITRY

BACKGROUND OF THE INVENTION

1. Field of the Invention

The present invention generally relates to an undershoot eliminating circuit for eliminating an undershoot of a pulse waveform, and more particularly to an undershoot eliminating circuit which provides a high impedance when the impedance of a pulse transmitter which is inactive (transmits no signal) is measured. Furthermore, the present invention is concerned with a pulse transmitter having such an undershoot eliminating circuit.

2. Description of the Related Art

Recently, there has been a requirement to transmit data at a high bit rate. For this requirement, data is converted into a high-bit-rate digital pulse waveform and transferred between communication devices. There has also been a requirement to simplify transmission lines between communication devices. To satisfy this requirement, a bus is shared by a plurality of communication devices. In order to realize the bus sharing communications, a transmitter output pulse mask is defined by, for example, CCITT Recommendation I. 430 (see FIG. 12/I. 430), the disclosure of which is hereby incorporated by reference. The pulse waveform should be within the pulse mask. Further, in order to realize the bus sharing communications, it is required that each transmitter has a high impedance to substantially isolate each transmitter from the shared bus when each transmitter is inactive or does not transmit any signal. According to the CCITT Recommendation I. 430, when each transmitter is inactive, the output impedance thereof shall exceed the template in FIG. 10/I. 430 in the frequency range of 2 kHz to 1 MHz. That is, it is required that the transmitter of each communication device connected to the shared bus meets both, the mask requirement when it is active and the impedance requirement when it is inactive.

Figure 1A:
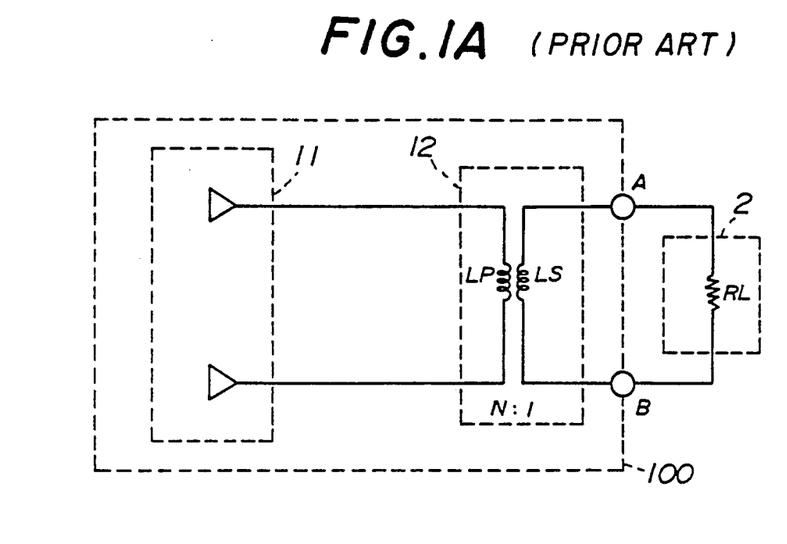
FIGS. 1A and 1B are circuit diagrams of a conventional pulse transmitter.

FIG. 1A shows a pulse transmitter that employs a transformer. A pulse transmitter 100 shown in FIG. 1A is connected across a load 2 having a load resistor RL via interface points A and B, and includes a pulse transformer driving circuit 11 and a pulse transformer 12. The pulse transformer 12 has a turns ratio N, a primary inductor (winding) LP, and a secondary inductor (winding) LS. The secondary winding LS is connected to a transmission line functioning as a shared bus.

Figure 1B:
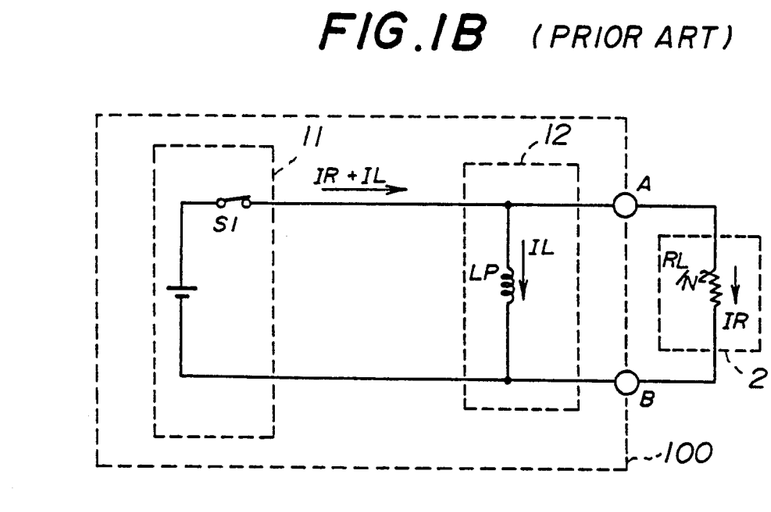

FIG. 1B is a circuit diagram showing an equivalent circuit of the pulse transmitter shown in FIG. 1A obtained when the pulse waveform has a peak. At this time, a switch S1 of the pulse transform driving circuit 11 is ON, while a current IR flows through the load resistor RL ($RL/N^2$), and a current LP flows through the primary winding of the pulse transformer 12. The ON state of the switch S1 indicates that the pulse transmitter 100 is transmitting a pulse. The OFF state of the switch S1 indicates that the pulse transmitter 100 is inactive or transmitting no signal.

Figure 2A:
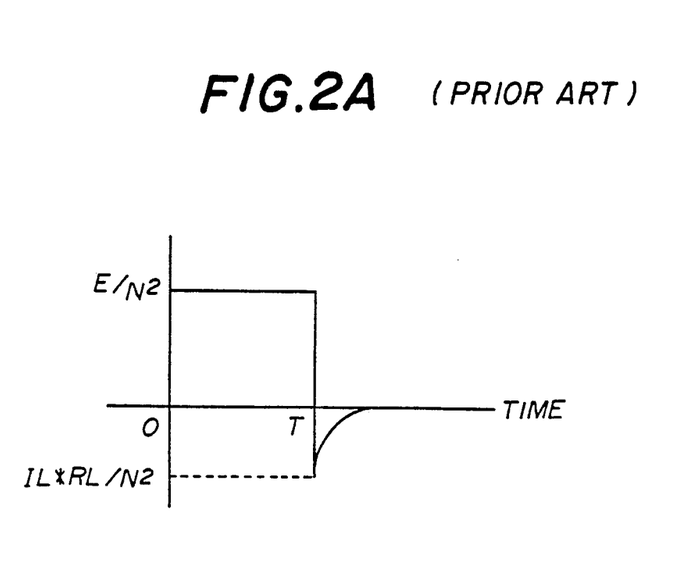
FIGS. 2A and 2B are diagrams illustrating a problem of the conventional pulse transmitter shown in FIGS. 1A and 1B.

FIG. 2A shows a waveform of the pulse developed across the load resistor RL ($RL/N^2$) in the equivalent circuit shown in FIG. 1B) when the switch S1 is initially ON and then turned OFF at time T. The instance the switch S1 turns OFF, a reverse voltage develops across the load resistor RL. This reverse voltage causes an undershoot of the pulse waveform output by the pulse transformer 12.

Figure 2B:
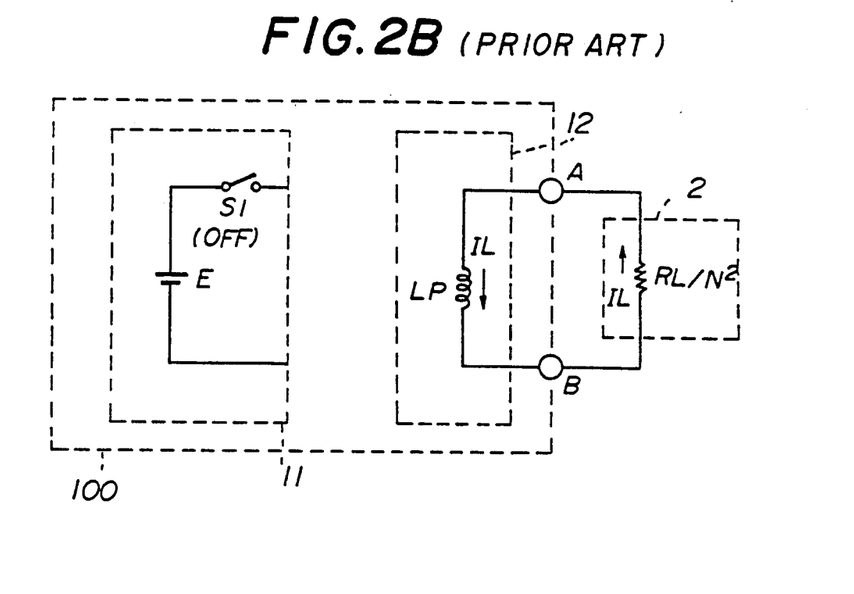

The manner in which the above problem comes about is as follows. The current IL is continuously passing through the primary inductor LP of the pulse transformer 12 until a time T. The instance the switch S1 turns OFF, the current IL is forced to flow continuously because of the magnetic characteristics of the pulse transformer 12. However, the switch S1 is turned OFF at this time, and the equivalent circuit of the pulse transmitter 100 is changed to a closed circuit as shown in FIG. 2B. Hence, the current IL forced to flow in the primary inductor LP develops a reverse voltage across the load resistor RL ($RL/N^2$). This reverse voltage corresponds to an undershoot of the pulse waveform.

Figure 3A:
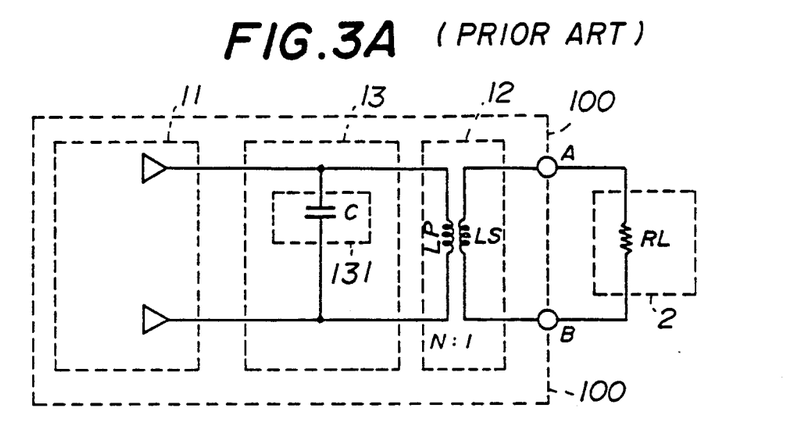
FIGS. 3A, 3B and 3C are diagrams of another conventional pulse transmitter.
Figure 3B:
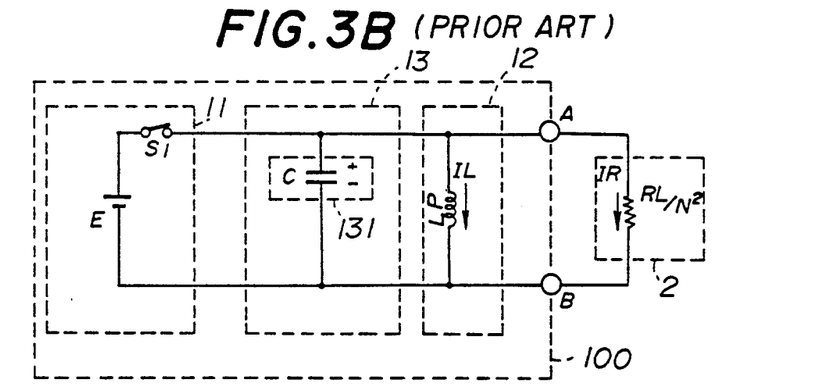
Figure 3C:
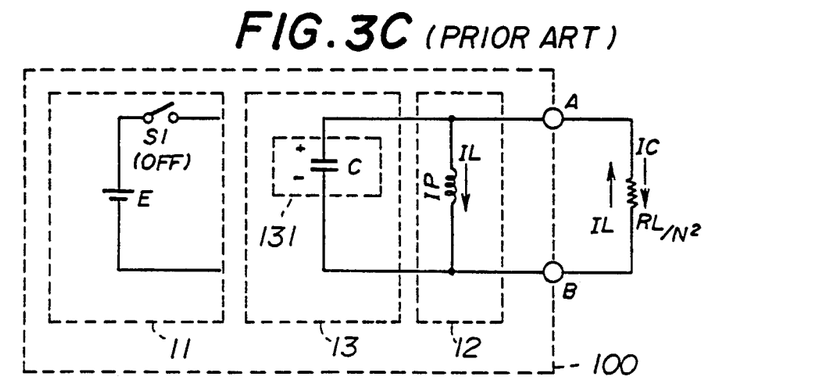

In order to eliminate the above undershoot, an undershoot eliminating circuit 131 is connected in parallel to the primary winding LP of the pulse transformer 12, as shown in FIG. 3A. The undershoot eliminating circuit 131 includes a capacitor C connected in parallel to the primary winding LP. As shown in FIG. 3B, a voltage E is applied across the capacitor C until the aforementioned time T. Hence, the capacitor C is charged so that it has polarities as shown in FIG. 3B. At the time T, the switch S1 turns OFF. At this time, the pulse transmitter 12 shown in FIG. 3A has an equivalent circuit shown in FIG. 3C. The capacitor supplies the load resistor RL ($RL/N^2$) with a backward current IC reverse to the current IL forced to pass through the load resistor RL ($RL/N^2$) due to the function of the primary inductor LP. Hence, the current IL is canceled by the current IC and no current passes through the load resistor RL ($RL/N^2$). In this manner, the undershoot can be eliminated from the pulse waveform.

Figure 4A:
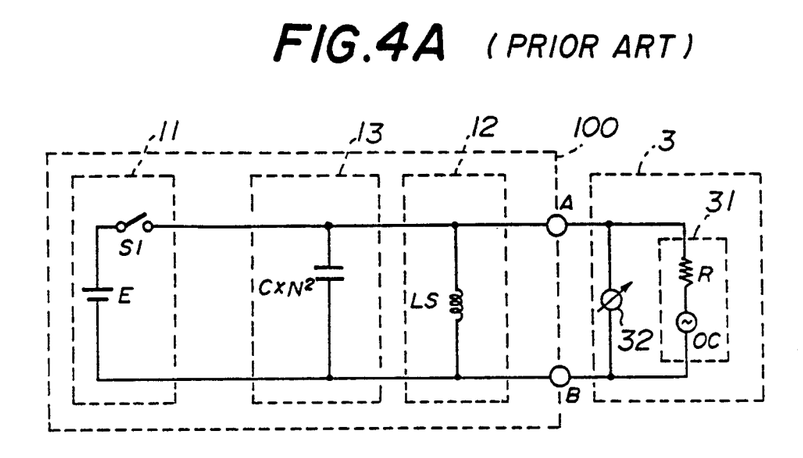
FIG. 4A is a circuit diagram showing how the impedance of the pulse transmitter shown in FIG. 3A is measured.

FIG. 4A shows an equivalent circuit of the pulse transmitter shown in FIG. 3A obtained when the impedance of the inactive pulse transmitter is measured. In this measurement, an impedance meter 3 is connected in parallel to the pulse transformer 12 via the interface points A and B. The impedance meter 3 is made up of a synthesizer 31, and a level meter 32. The synthesizer 31 comprises a resistor R and an oscillator OC connected in series. The synthesizer 31 generates a sine wave having a predetermined frequency and a predetermined power level. The level meter 32 measures a voltage level developed across the load (in this case, the interface points A and B of the pulse transmitter 100). The impedance of the load (the pulse transmitter 100 in this case) is calculated from a voltage level indicated by the level meter 32. The frequency and the voltage of the sine wave generated by the synthesizer 31 can be varied, and the impedance of the load connected to the impedance meter 3 can be obtained by measuring a current passing through the impedance meter 3.

When the switch S1 is OFF, the impedance Z of the pulse transmitter 100 is written as follows:

$$Z = 1/\{(1/j\omega LS) + j\omega C \times N^2\} \tag{1}$$

where $\omega$ is equal to $2\pi f$, f denotes the frequency of the sine wave, and LS denotes the inductance of the pulse transformer 12.

When the frequency is high, the expression (1) can be made to approximate to expression (2):

$$Z = 1/j\omega C \times N^2.$$

It can be seen from the expression (2) that there is a tendency such that as the capacitance of the capacitor C, provided for eliminating an undershoot of the pulse waveform, increases or as the measurement frequency increases, the impedance of the pulse transmitter 100 decreases.

Figure 4B:
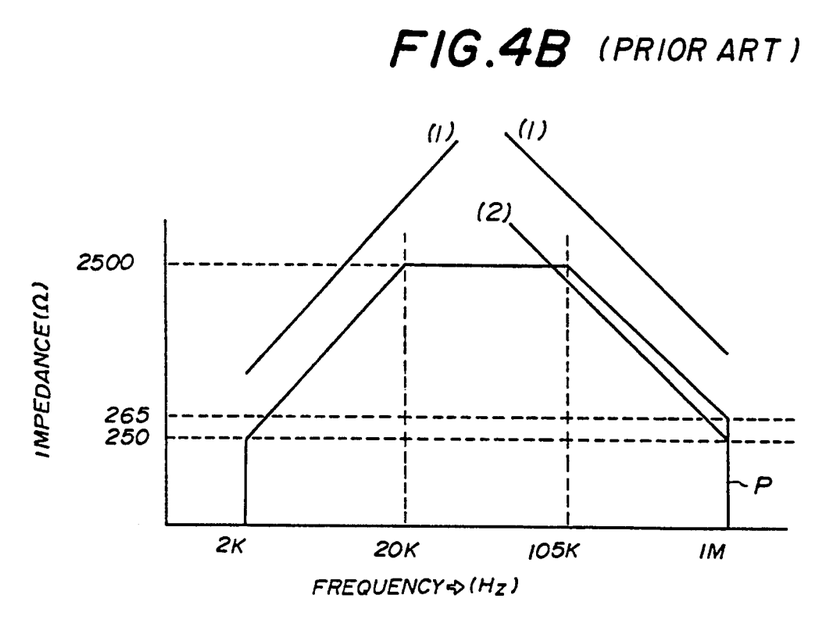
FIG. 4B is a graph showing an impedance characteristic of the pulse transmitter prescribed by the CCITT Recommendation I. 430 and illustrating a problem of the conventional pulse transmitter shown in FIGS. 3A.

FIG. 4B shows the aforementioned impedance characteristic of an NT (Network Termination unit) pulse transmitter for use in the bus connection prescribed in the CCITT Recommendation I. 430. The above impedance characteristic is indicated by symbol P. It is required that the pulse transmitter has an impedance exceeding the impedance defined by the impedance characteristic curve P in the range of 2 kHz to 1 MHz.

Recently, there has been a requirement to use a compact transformer in order to miniaturize the pulse transmitter and reduce the production cost. In general, such a compact transformer has an impedance characteristic indicated by lines (1) shown in FIg. 4B. That is, the compact transformer does not have a large impedance margin with respect to the impedance characteristic prescribed by the CCITT Recommendation I. 430. When the capacitor C for eliminating an undershoot of the pulse waveform is connected as shown in FIG. 3A, the impedance characteristic of the pulse transmitter 100 changes as shown by a line indicated by (2) in a high-frequency range (the impedance characteristic obtained in a low-frequency range is omitted for the sake of clarify). It can be seen from FIG. 4B that the impedance characteristic in the high-frequency range does not meet the impedance characteristic prescribed by the CCITT Recommendation I. 430. As the capacitance of the capacitor C for eliminating an undershoot of the pulse waveform increases in order to meet the pulse mask defined by the CCITT Recommendation I. 430, the impedance margin with respect to the prescribed impedance characteristic decreases and finally the impedance characteristic of the pulse transmitter fails to meet the prescribed impedance characteristic.

In the conventional technique, the capacitance of the capacitor is manually adjusted during the production process so that both the pulse mask requirement and the impedance characteristic requirement are satisfied. However, this needs a large number of production steps and test steps.

SUMMARY OF THE INVENTION

It is a general object of the present invention to provide an undershoot eliminating circuit in which the above disadvantages are eliminated.

A more specific object of the present invention is to provide an undershoot eliminating circuit capable of eliminating an undershoot of a pulse waveform without degrading the impedance characteristic, particularly in a high-frequency range.

The above objects of the present invention are achieved by an undershoot eliminating circuit provided between a pulse transformer of a pulse transmitter coupled to a transmission line and a pulse transformer driving circuit for driving the pulse transformer, the pulse transformer driving circuit having an impedance high enough to cause the pulse transmitter to be substantially isolated from the transmission line. The undershoot eliminating circuit includes a capacitor, and switching means, connected to the capacitor, for selectively connecting the capacitor to the pulse transformer driving circuit and the pulse transformer in parallel on the basis of a voltage based on a pulse wave generated by the pulse transformer driving circuit and applied across the switching means.

Another object of the present invention is to provide a pulse transmitter having the above-mentioned undershoot eliminating circuit.

This object of the present invention is achieved by a pulse transmitter comprising: a pulse transformer coupled to a transmission line; pulse transformer driving means, coupled to the pulse transformer, for generating a pulse wave to drive the pulse transformer, which is made to transmit a pulse signal to the transmission line, and for providing an impedance high enough to cause the pulse transmitter to be substantially isolated from the transmission line; a capacitor; and switching means, connected to the capacitor, for selectively connecting the capacitor to the pulse transformer driving means and the pulse transformer in parallel on the basis of a voltage based on a pulse wave generated by the pulse transformer driving means and applied across the switching means.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 5A:
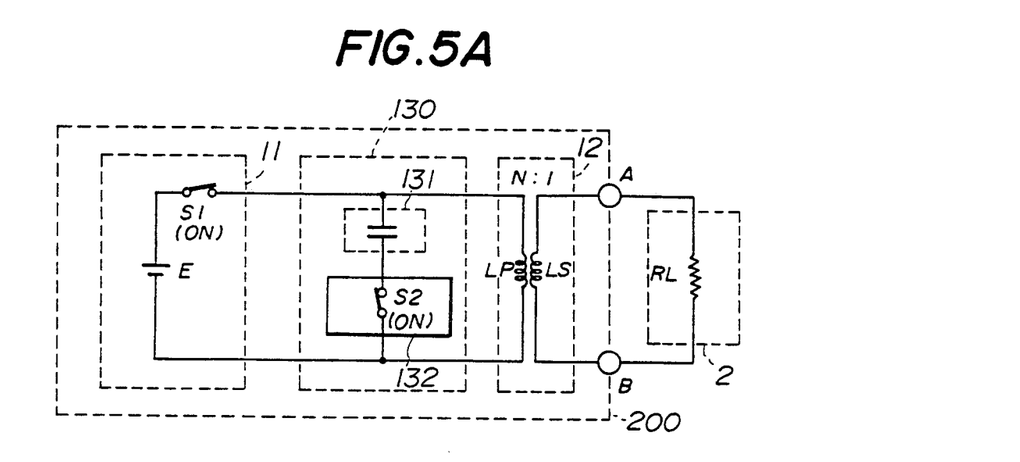
FIGS. 5A and 5B are circuit diagrams illustrating an overview of a pulse transmitter having an undershoot eliminating circuit of the present invention.
Figure 5B:
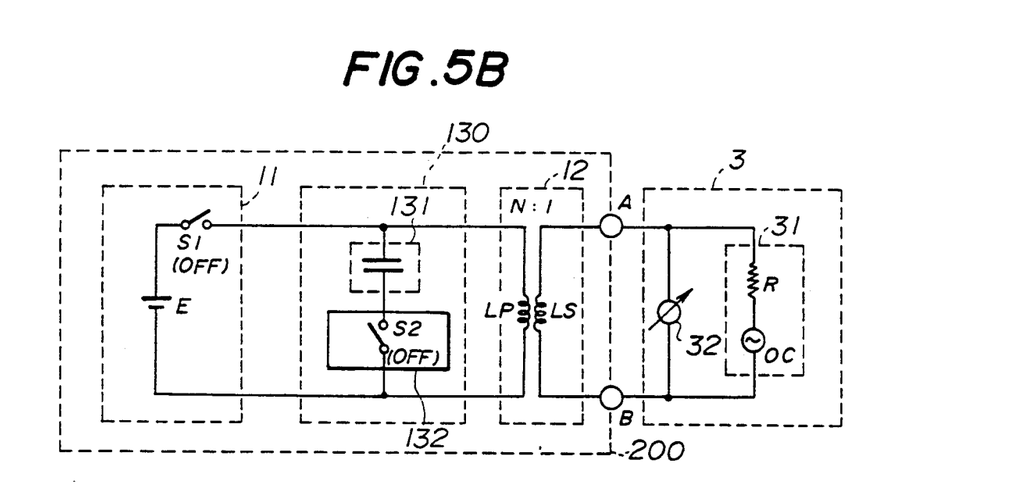

FIGS. 5A and 5B are diagrams showing an overview of a pulse transmitter having an undershoot eliminating circuit according to the present invention. In FIGS. 5A and 5B, parts which are the same as parts shown in the previous figures are given the same reference numerals as previously.

A pulse transmitter 200 shown FIG. 5A comprises the aforementioned pulse transformer driving circuit 11, an undershoot eliminating circuit 130 and the aforementioned pulse transformer 12. The undershoot eliminating circuit 130 comprises a capacitor unit 131 and a voltage-controlled switching unit 132. The voltage-controlled switching unit 132 includes a switch S2. The switch S2 is in the conducting state (FIG. 5A) while a pulse wave is being transmitted, that is, while the switch S1 in the pulse transformer driving circuit 11 is ON or active. The switch S2 is in the non-conducting state (FIG. 5B) while no pulse wave is transmitted, that is, while the pulse transformer driving circuit 11 is OFF or inactive. As will be described later, the switch S2 is formed with, for example, a voltage clamping element, such as a varister, or a voltage-sensitive switching element.

Figure 6A:
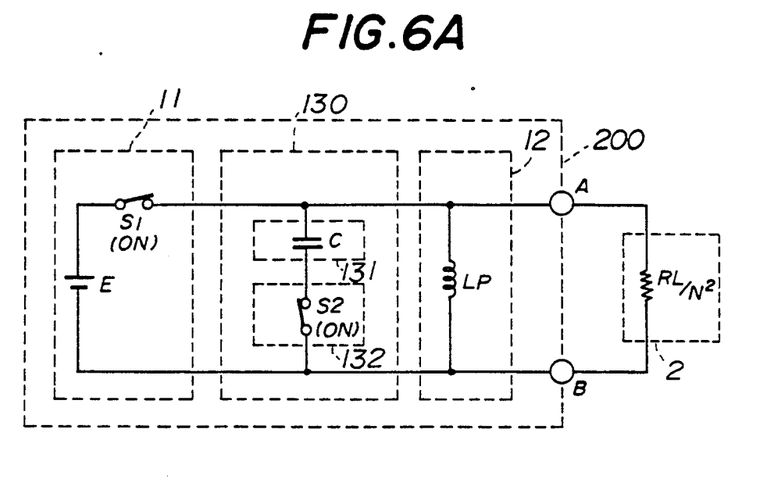
FIGS. 6A and 6B are equivalent circuit diagrams of the pulse transmitter of FIGS. 5A and 5B.

When a pulse wave is transmitted, the switch S2 is ON, and the capacitor unit 131 is connected across the primary winding LP of the pulse transformer 12, as shown in FIG. 6A. Hence, an undershoot of the pulse wave is eliminated by the capacitor unit 131, and the pulse wave transmitted by the pulse transmitter 200 meets the aforementioned pulse mask requirement.

Figure 6B:
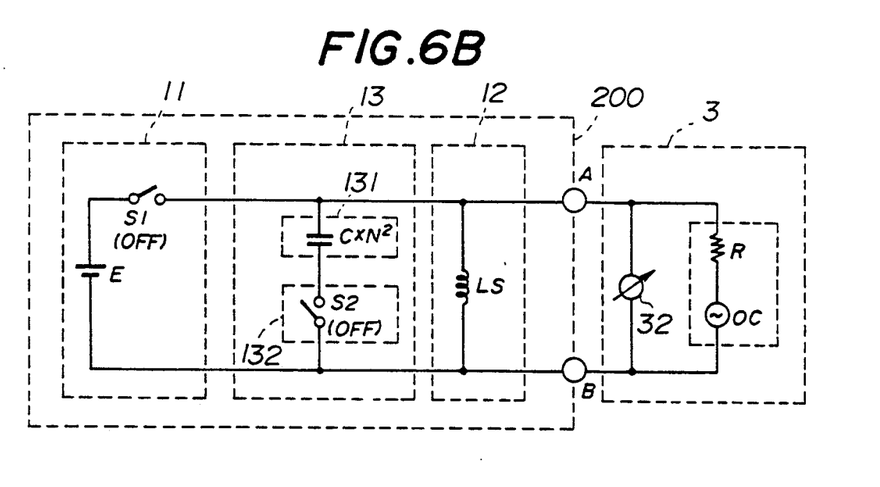

In the state in which the impedance of the pulse transmitter 200 is measured when the pulse transformer driving circuit 11 is inactive, the switch S2 is OFF and the capacitor unit 131 is disconnected from the pulse transformer 12, as shown in FIG. 6B. Hence, it is possible to prevent a decrease in the impedance of the pulse transmitter 200 due to the capacitor unit 131, particularly, in a high-frequency range.

Figure 7A:
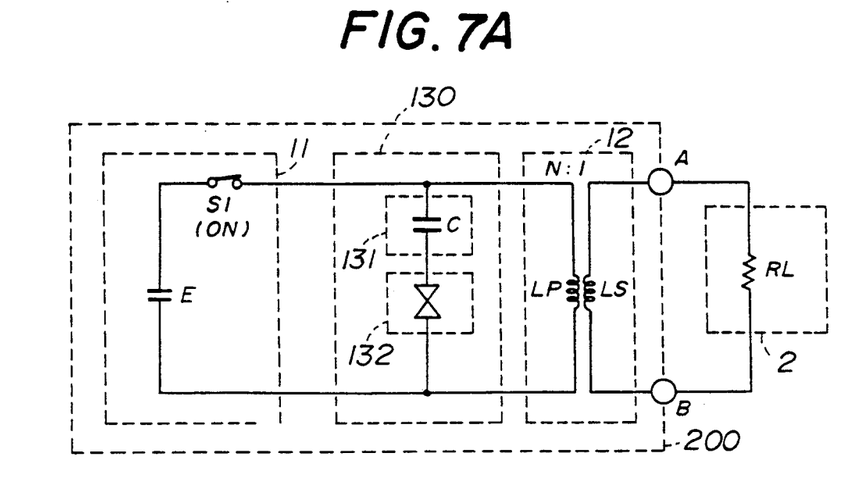
FIG. 7A is a circuit diagram of a pulse transmitter having an undershoot eliminating circuit according to a first ewmbodimet of the present invention.
Figure 7B:
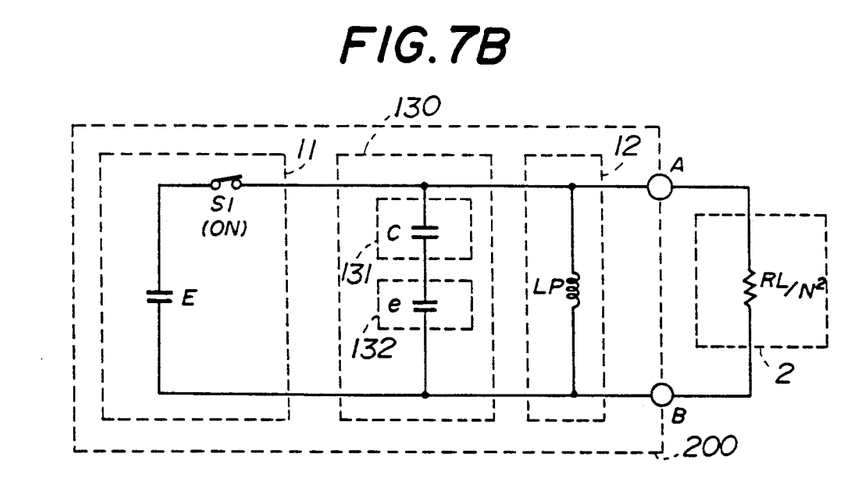
FIG. 7B is an equivalent circuit diagram of the pulse transmitter shown in FIG. 7A.

FIG. 7A is a circuit diagram of a pulse transmitter having an undershoot eliminating circuit according to a first embodiment of the present invention. FIG. 7B is an equivalent circuit diagram of the pulse transmitter 200 shown in FIG. 7A. In FIGS. 7A and 7B, parts which are the same as parts shown in the previously described figures are given the same reference numerals as previously. The switch S2 of the voltage-controlled switching unit 132 is formed with a varister.

The varister is a voltage clamping element. The varister 132 has a clamping voltage e lower than a power supply voltage E in the pulse transformer driving circuit 11. The equivalent circuit of the pulse transmitter 200 is shown in FIG. 7B. In the equivalent circuit shown in FIG. 7B, a voltage source e in the voltage-controlled switching unit 132 is deemed to be in the conducting state (ON). Hence, an undershoot of a pulse wave can be eliminated due to the function of the capacitor C in the capacitor unit 131.

A charge Q stored in the capacitor C when the voltage clamping element is not used, is as follows:

$$Q = C \cdot E.$$

On the other hand, when the varister 132 having the clamping voltage e is used, the voltage applied to the capacitor C is decreased by the clamping voltage e, and hence a reduced amount of charge is stored in the capacitor C. Hence, it is necessary to use the capacitor C having an increased amount of charge equal to the above-mentioned charge obtained when the voltage clamping element is not used.

Figure 8A:
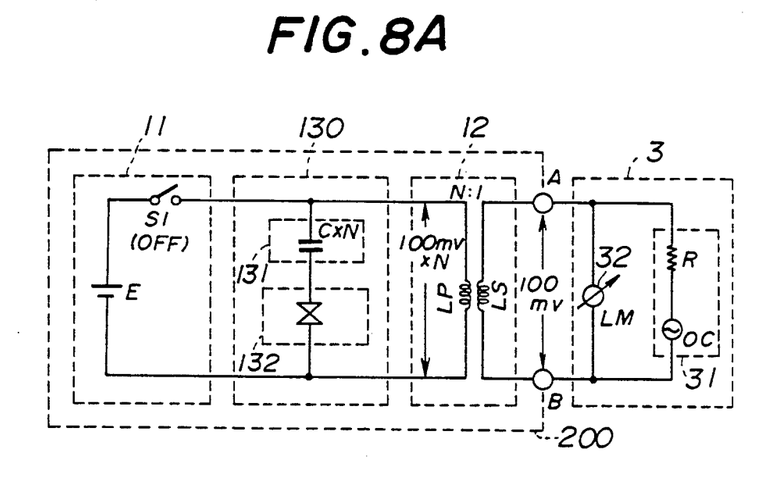
FIGS. 8A and 8B are circuit diagrams showing how the impedance of the pulse transmitter shown in FIG. 7A is measured.
Figure 8B:
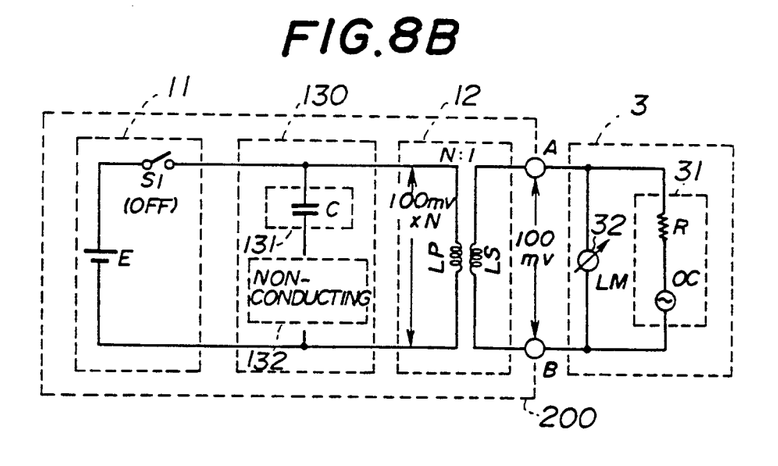

A description will now be given, with reference to FIGS. 8A and 8B, of the impedance measurement of the pulse transmitter 200. According to the CCITT Recommendation I. 430, the impedance of the pulse transmitter is measured by applying a voltage of 100 mV to a load of the pulse transmitter 200, that is, applying a voltage V1 of 100 mv across the interface points A and B shown in FIG. 8A. When a voltage of 100 mV is applied across the interface points A and B, a voltage equal to $(100 \times N)$ mV is induced in the primary winding LP of the pulse transformer 12. At this time, in order to maintain the varister 132 in the non-conducting state, it is required that the varister 132 has a clamping voltage higher than $(100 \times N)$ mV. Since the varister is deemed to be in the non-conducting state for a voltage equal to or lower than the clamping voltage e, the equivalent circuit obtained at this time is as shown in FIG. 8B. As shown in FIG. 8B, the impedance meter 3 is not at all affected by the capacitor C. Hence, it is possible to prevent a decrease in the impedance of the pulse transmitter due to the capacitor C, particularly in a high-frequency range.

The present invention is not limited to the interface requirement prescribed in the CCITT I. 430 but is applicable to other similar interface requirements.

Figure 9:
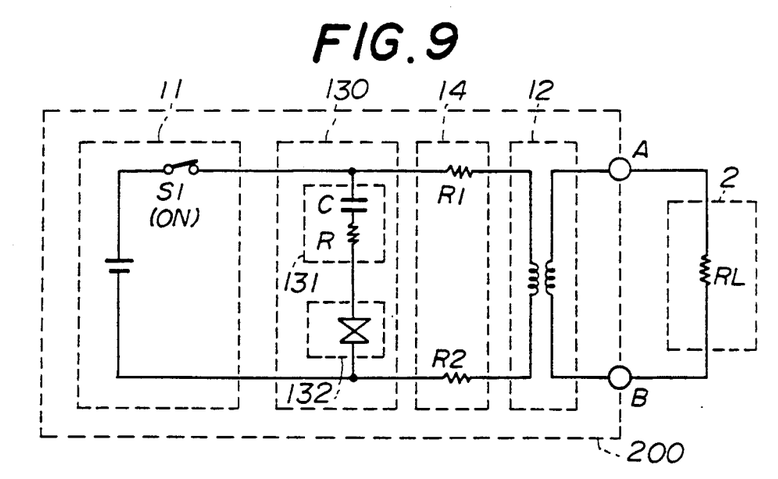
FIG. 9 is a circuit diagram of a pulse transmitter having an undershoot eliminating circuit according to a second embodiment of the present invention.

As shown in FIG. 9, it is preferable that a pulse amplitude adjustment circuit 14 be connected between the undershoot eliminating circuit 130 and the primary winding of the pulse transformer 12. The pulse amplitude adjustment circuit 14 comprises a resistor R1 and a resistor R2. The resistor R1 is connected between one end of the capacitor C and one end of the primary winding LP of the pulse transformer 12. The resistor R2 is connected to one end of the varister 132 and to the other end of the primary winding LP of the pulse transformer 12. A resistor R is connected in series to the capacitor C. The resistor R also functions to make the impedance match the load connected to the pulse transmitter 200.

Figure 10A:
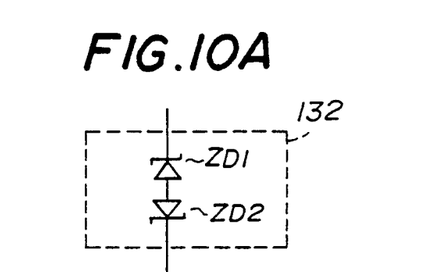
FIG. 10A is a circuit diagram of a voltage-controlled switching unit that can be used in the present invention.

It is also possible to use another switching element in lieu of the varister. FIG. 10A shows the voltage-controlled switching unit 132 comprising Zener diodes ZD1 and ZD2 connected so that the anodes of the Zener diodes ZD1 and ZD2 are connected to each other. Each of the Zener diodes ZD1 and ZD2 has the above-mentioned clamping voltage e.

Figure 10B:
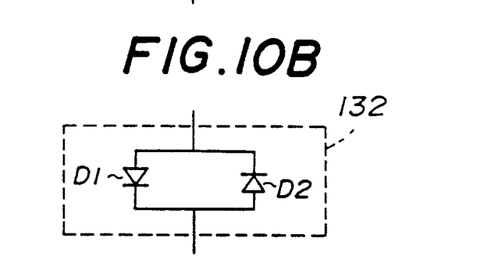
FIG. 10B is a circuit diagram of another voltage-controlled switching unit that can be used in the present invention.
Figure 10C:
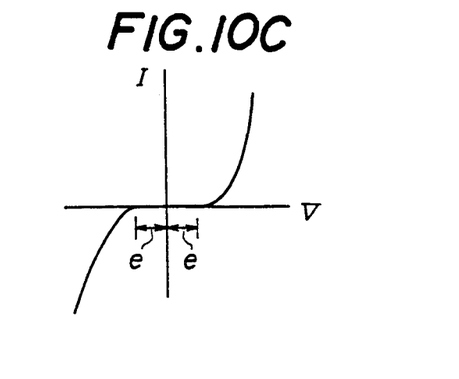
FIG. 10C is a graph showing a characteristic of the switching unit shown in FIG. 10B.

FIG. 10B shows the voltage-controlled switching unit 132 comprising diodes D1 and D2 for use in rectification. The diodes D1 and D2 are connected so that the cathode of the diode D1 is connected to the anode of the diode D2 and the cathode of the diode D2 is connected to the anode of the diode D1. Each of the diodes D1 and D2 has a threshold voltage equal to the above-mentioned clamping voltage e. The voltage-controlled switching unit 132 shown in FIG. 10B has a voltage-current characteristic as shown in FIG. 10C. The voltage-current characteristic shown in FIG. 10C corresponds to a combination of the rectifying characteristics of the diodes D1 and D2. If the pulse transformer 12 has a small turns ratio equal to, for example, 2, in order to satisfy the following:

$$100\ mV \times 2 < e < E$$

it is required that each of the diodes D1 and D2 has the threshold voltage e satisfying the following:

$$e > 200\ mV.$$

Figure 10D:
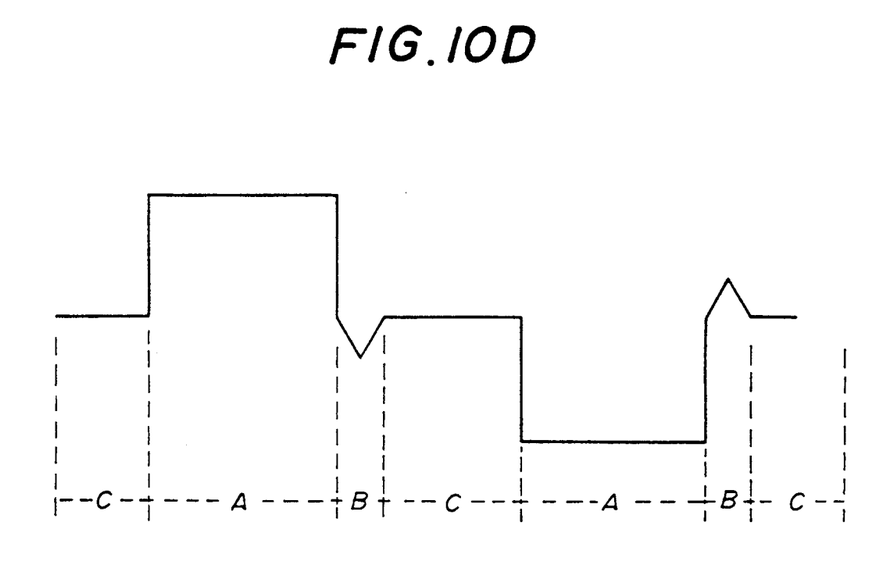
FIG. 10D is a waveform diagram for explaining the operation of the switching unit used in the present invention.

FIG. 10D shows a waveform of a pulse train (AMI code) obtained when the undershoot eliminating circuit 130 is not used. The waveform of the pulse train shown in FIG. 10D has three states A, B and C. In the state C, the pulse transmitter 200 is inactive and thus required to provide an impedance high enough to substantially isolate it from the transmission line. Thus, the switching unit 132 is opencircuited (OFF). In the state B, an undershoot of the pulse waveform takes place, and hence the switching unit 132 is ON. In the state A, a pulse signal is being transmitted. In order to eliminate an undershoot as occurring in the state B, the switching unit 132 is ON in the state A. According to the present invention, the undershoots of the pulse waveform as in the state B can be eliminated without decreasing the impedance of the pulse transmitter, particularly, in the high-frequency range. The ON/OFF control is based on the voltage applied across the switching unit 132.

Figure 11A:
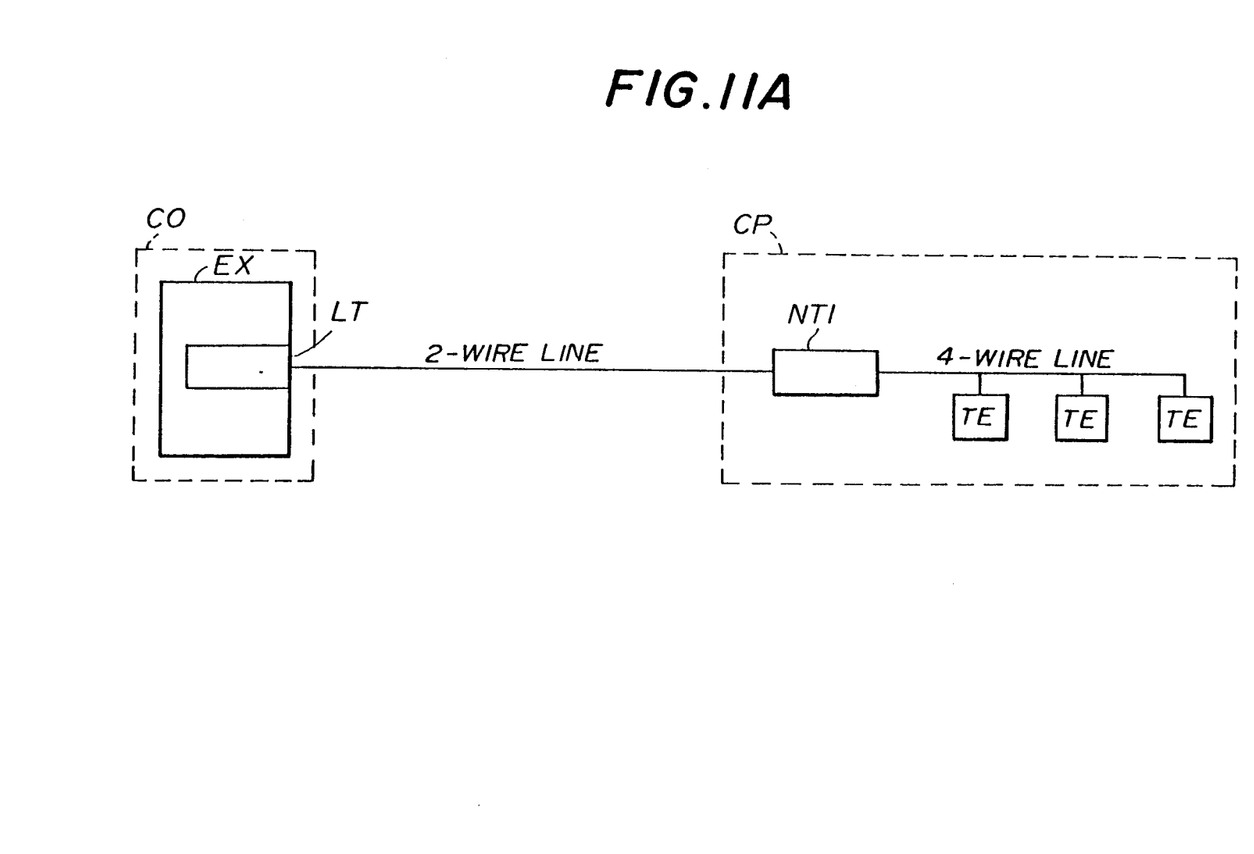
FIG. 11A is a block diagram of a communications system to which the present invention can be applied.

The present invention is applied to a communications system as shown in FIG. 11A. The communications system shown in FIG. 11A comprises a central office CO and a customer premise CP. The central office CO comprises an exchange EX and a line termination unit LT installed in the exchange EX. The customer premise CP comprises a network termination unit NT1 and a plurality of terminal equipments TE. A two-wire line is provided for connecting the line termination unit LT and the network termination unit NT1. Data is transferred via the two-wire line in, for example, a ping-pong transfer method using an AMI code or an echo canceler method using a 2B1Q code. A four-wire line, which is a shared bus, is used for connecting the terminal equipments TE to the network termination unit NT1. Data is transferred via the four-wire line in a transmission method prescribed in the CCITT Recommendation I. 430.

Figure 11B:
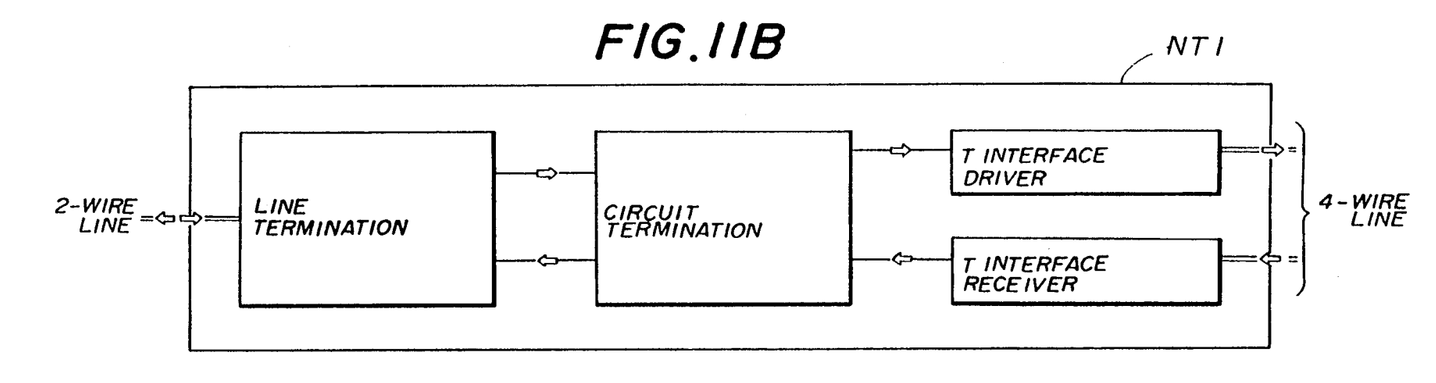
FIG. 11B is a block diagram of a network termination unit shown in FIG. 11A.

FIG. 11B shows the structure of the network termination unit NT1. As shown in FIG. 11B, the network termination unit NT1 comprises the above-mentioned line termination unit LT, a circuit termination unit CT, a T interface driver T-DV, and a T interface receiver T-RV. The circuit termination unit CT functions as a converter providing an interface between the two-wire line and the four-wire line. The interface driver T-DV outputs data to the four-wire line (shared bus), and the interface receiver T-RV receives data from the four-wire line. The present invention is installed in the interface driver T-DV.

Figure 11C:
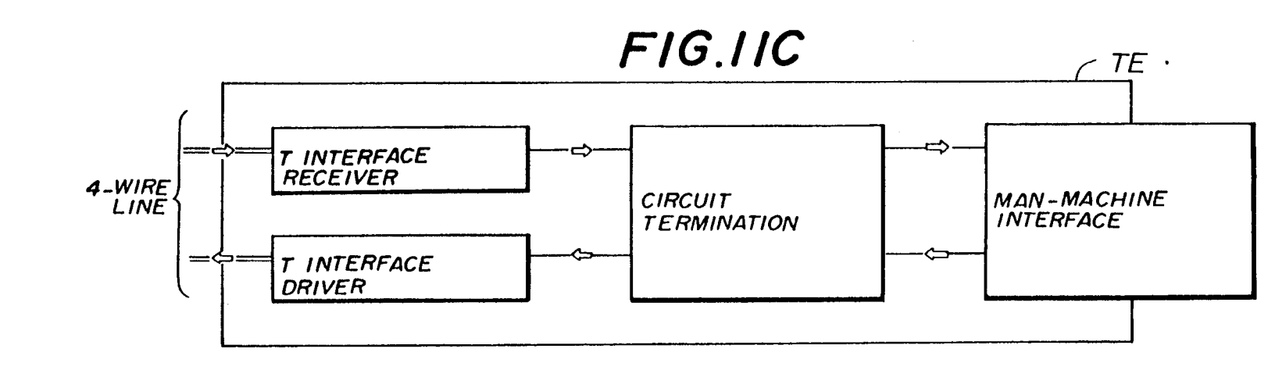
FIG. 11C is a block diagram of terminal equipment shown in FIG. 11A.

FIG. 11C shows the structure of each terminal equipment TE. The terminal equipment TE shown in FIG. 11C comprises a T interface receiver T-RV, a T interface driver T-DR, a circuit termination unit CT, and a man-machine interface HI. The present invention is installed in the interface driver T-DV shown in FIG. 11C.

The present invention is not limited to the specifically disclosed embodiments, and variations and modifications may be made without departing from the scope of the present invention.

What is claimed is:

1. An undershoot eliminating circuit provided between a pulse transformer of a pulse transmitter coupled to a transmission line and a pulse transformer driving circuit for driving the pulse transformer, the pulse transformer driving circuit having an impedance high enough to cause the pulse transmitter to be substantially isolated from the transmission line, said undershoot eliminating circuit comprising:
    a capacitor; and
    switching means, connected in series with the capacitor, for selectively connecting said capacitor to both the pulse transformer driving circuit and the pulse transformer in parallel on the basis of a voltage based on a pulse wave generated by the pulse transformer driving circuit and applied across the switching means.

2. An undershoot eliminating circuit as claimed in claim 1, wherein said switching means comprises means for isolating said capacitor from the pulse transformer driving circuit and the pulse transformer only when the pulse transformer driving circuit is inactive and does not generate the pulse wave.

3. An undershoot eliminating circuit as claimed in claim 1, wherein said switching means comprises means for providing an impedance high enough to isolate said capacitor from the pulse transformer driving circuit and the pulse transformer only when the pulse transformer driving circuit is inactive and does not generate the pulse wave.

4. An undershoot eliminating circuit as claimed in claim 1, wherein said switching means comprises a varister connected in series to the capacitor.

5. An undershoot eliminating circuit as claimed in claim 1, wherein:
    said switching means is connected in series to the capacitor;
    said switching means comprises a first Zener diode and a second Zener diode;
    the first Zener diode has an anode and a cathode, and the second Zener diode has an anode and a cathode; and
    the first and second Zener diodes are connected in series so that the anode of the first Zener diode is connected to the anode of the second Zener diode.

6. An undershoot eliminating circuit as claimed in claim 1, wherein:
    said switching means is connected in series to the capacitor;
    said switching means comprises a first diode and a second diode;
    the first diode has an anode and a cathode, and the second diode has an anode and a cathode; and
    the anode of the first diode is connected to the cathode of the second diode, and the cathode of the first diode is connected to anode of the second diode.

7. An undershoot eliminating circuit as claimed in claim 4, wherein:
    said varister has a clamping voltage higher than a voltage equal to V1×N, where V1 is a voltage applied across a secondary winding of the pulse transformer when an impedance of the pulse transmitter is measured, and N is a turns ratio of the pulse transformer; and the voltage equal to V1×N appears in a primary winding of the pulse transformer when said voltage V1 is applied across the secondary winding.

8. An undershoot eliminating circuit as claimed in claim 5, wherein:

a series circuit composed of said first and second Zener diodes has a threshold voltage which determines ON/OFF states of said series circuit; and said threshold voltage is higher than a voltage equal to V1×N, where V1 is a voltage applied across a secondary winding of the pulse transformer when an impedance of the pulse transmitter is measured, and N is a turns ratio of the pulse transformer; and the voltage equal to V1×N appears in a primary winding of the pulse transformer when said voltage V1 is applied across the secondary winding.

9. An undershoot eliminating circuit as claimed in claim 6, wherein:

a parallel circuit composed of said first and second diodes has a threshold voltage which determines ON/OFF states of said parallel circuit; and said threshold voltage is higher than a voltage equal to V1×N, where V1 is a voltage applied across a secondary winding of the pulse transformer when an impedance of the pulse transmitter is measured, and N is a turns ratio of the pulse transformer; and the voltage equal to V1×N appears in a primary winding of the pulse transformer when said voltage V1 is applied across the secondary winding.

10. An undershoot eliminating circuit as claimed in claim 1, further comprising a resistor connected in series to said capacitor.

11. An undershoot eliminating circuit as claimed in claim 1, further comprising a first resistor connected between the pulse transformer and the capacitor, and a second resistor connected between the pulse transformer and the switching means.

12. A pulse transmitter comprising:

a pulse transformer coupled to a transmission line;

pulse transformer driving means, coupled to said pulse transformer, for generating a pulse wave to drive the pulse transformer made to transmit line and for providing an impedance high enough to cause the pulse transmitter to be substantially isolated from the transmission line;

a capacitor; and switching means, connected in series with the capacitor, for selectively connecting said capacitor to both the pulse transformer driving means and the pulse transformer in parallel on the basis of a voltage based on a pulse wave generated by the pulse transformer driving means and applied across the switching means.

13. A pulse transmitter as claimed in claim 12, wherein said switching means comprises means for isolating said capacitor from the pulse transformer driving means and the pulse transformer only when the pulse transformer driving means does not generate the pulse wave.

14. A pulse transmitter as claimed in claim 12, wherein said switching means comprises means for providing an impedance high enough to isolate said capacitor from the pulse transformer driving means and the pulse transformer only when the pulse transformer driving means does not generate the pulse wave.

15. A pulse transmitter as claimed in claim 12, wherein said switching means comprises a varister connected in series to the capacitor.

16. A pulse transmitter as claimed in claim 12, wherein:

said switching means is connected in series to said capacitor;

said switching means comprises a first Zener diode and a second Zener diode;

the first Zener diode has an anode and a cathode, and the second Zener diode has an anode and a cathode; and the first and second Zener diodes are connected in series so that the anode of the first Zener diode is connected to the anode of the second Zener diode.

17. A pulse transmitter as claimed in claim 12, wherein:

said switching means is connected in series to said capacitor;

said switching means comprises a first diode and a second diode;

the first diode has an anode and a cathode, and the second diode has an anode and a cathode; and the anode of the first diode is connected to the cathode of the second diode, and the cathode of the first diode is connected to anode of the second diode, wherein said first diode and said second diode have predetermined thresholds.

* * * * *